(12) United States Patent
Chia et al.

(10) Patent No.: US 11,031,362 B2
(45) Date of Patent: Jun. 8, 2021

(54) 3D-INTERCONNECT

(71) Applicant: Invensas Corporation, San Jose, CA (US)

(72) Inventors: Chok J. Chia, Cupertino, CA (US); Qwai H. Low, Cupertino, CA (US); Patrick Variot, Los Gatos, CA (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 16/245,925

(22) Filed: Jan. 11, 2019

(65) Prior Publication Data

US 2019/0148324 A1 May 16, 2019

Related U.S. Application Data

(62) Division of application No. 15/493,917, filed on Apr. 21, 2017, now Pat. No. 10,181,447.

(51) Int. Cl.
*H01L 21/56* (2006.01)
*H01L 23/00* (2006.01)
(Continued)

(52) U.S. Cl.
CPC .............. *H01L 24/09* (2013.01); *H01L 21/52* (2013.01); *H01L 21/568* (2013.01);
(Continued)

(58) Field of Classification Search
CPC ......... H01L 24/09; H01L 24/20; H01L 24/19; H01L 23/5386; H01L 23/5389;
(Continued)

(56) References Cited

U.S. PATENT DOCUMENTS 3,968,500 A 7/1976 Meisel et al.
4,700,276 A 10/1987 Freyman et al.
(Continued)

FOREIGN PATENT DOCUMENTS

CN 1292635 A 4/2001
EP 1093329 A2 4/2001
(Continued)

OTHER PUBLICATIONS

International Search Report and Written Opinion for Application No. PCT/US2014/027699 dated Jul. 17, 2014.
(Continued)

*Primary Examiner* — Charles D Garber
*Assistant Examiner* — S M Sohel Imtiaz
(74) *Attorney, Agent, or Firm* — Lerner, David, Littenberg, Krumholz & Mentlik, LLP

(57) ABSTRACT

A method of making a microelectronic package includes bonding a conductive structure to a carrier. The conductive structure can include a base and a plurality of interconnections extending continuously away from the base toward the carrier. The microelectronic element can be positioned between at least two adjacent interconnections of the plurality of interconnections. The conductive structure may be bonded to the carrier so that the conductive structure overlies a rear surface of a microelectronic element disposed on the carrier and an exposed top surface of the carrier. The plurality of interconnections and the microelectronic element may be encapsulated. The carrier may be removed to expose free ends of the interconnections and bond pads of the microelectronic element. The free ends of the interconnections and bond pads of the microelectronic element may be conductively connected with terminals of the microelectronic package. The conductive structure may be patterned to form external contacts.

20 Claims, 8 Drawing Sheets

(51) Int. Cl.
*H01L 21/52* (2006.01)
*H01L 25/065* (2006.01)
*H01L 23/538* (2006.01)
*H01L 23/31* (2006.01)
*H01L 25/10* (2006.01)
*H01L 23/498* (2006.01)

(52) U.S. Cl.
CPC ...... *H01L 23/5386* (2013.01); *H01L 23/5389* (2013.01); *H01L 24/17* (2013.01); *H01L 24/19* (2013.01); *H01L 24/20* (2013.01); *H01L 24/81* (2013.01); *H01L 25/0652* (2013.01); *H01L 23/3128* (2013.01); *H01L 23/49816* (2013.01); *H01L 25/105* (2013.01); *H01L 2224/02331* (2013.01); *H01L 2224/0401* (2013.01); *H01L 2224/04105* (2013.01); *H01L 2224/12105* (2013.01); *H01L 2224/16235* (2013.01); *H01L 2224/27002* (2013.01); *H01L 2224/32245* (2013.01); *H01L 2224/73267* (2013.01); *H01L 2224/83191* (2013.01); *H01L 2224/92244* (2013.01); *H01L 2224/96* (2013.01); *H01L 2225/1035* (2013.01); *H01L 2225/1041* (2013.01); *H01L 2225/1058* (2013.01); *H01L 2924/351* (2013.01)

(58) Field of Classification Search
CPC ..... H01L 25/0652; H01L 24/81; H01L 21/52; H01L 21/568; H01L 24/17
See application file for complete search history.

(56) References Cited

U.S. PATENT DOCUMENTS

| | | |
|---|---|---|
| 4,829,403 A | 5/1989 | Harding |
| 4,855,868 A | 8/1989 | Harding |
| 5,030,796 A | 7/1991 | Swanson et al. |
| 5,406,117 A | 4/1995 | Dlugokecki et al. |
| 5,454,161 A | 10/1995 | Beilin et al. |
| 5,455,390 A | 10/1995 | DiStefano et al. |
| 5,483,421 A | 1/1996 | Gedney et al. |
| 5,629,241 A | 5/1997 | Matloubian et al. |
| 5,932,254 A | 8/1999 | Mitchell et al. |
| 5,990,418 A | 11/1999 | Bivona et al. |
| 5,998,861 A | 12/1999 | Hiruta |
| 6,046,910 A | 4/2000 | Ghaem et al. |
| 6,107,679 A | 8/2000 | Noguchi |
| 6,126,428 A | 10/2000 | Mitchell et al. |
| 6,127,724 A | 10/2000 | DiStefano |
| 6,228,676 B1 | 5/2001 | Glenn et al. |
| 6,255,738 B1 | 7/2001 | Distefano et al. |
| 6,365,975 B1 | 4/2002 | DiStefano et al. |
| 6,373,273 B2 | 4/2002 | Akram et al. |
| 6,602,740 B1 | 8/2003 | Mitchell |
| 6,646,337 B2 | 11/2003 | Iijima et al. |
| 6,873,039 B2 | 3/2005 | Beroz et al. |
| 7,060,761 B2 | 6/2006 | Arai et al. |
| 7,501,839 B2 | 3/2009 | Chan et al. |
| 7,510,912 B2 | 3/2009 | Caletka et al. |
| 7,553,752 B2 | 6/2009 | Kuan et al. |
| 7,749,882 B2 | 7/2010 | Kweon et al. |
| 7,759,782 B2 | 7/2010 | Haba et al. |
| 7,776,649 B1 | 8/2010 | Fan |
| 8,035,192 B2 | 10/2011 | Fujii |
| 8,071,424 B2 | 12/2011 | Haba et al. |
| 8,093,705 B2 | 1/2012 | Park et al. |
| 8,164,158 B2 | 4/2012 | Lin |
| 8,304,915 B2 | 11/2012 | Mori et al. |
| 8,372,689 B2 | 2/2013 | Lee et al. |
| 8,379,400 B2 | 2/2013 | Sunohara |
| 8,421,210 B2 | 4/2013 | Chi et al. |
| 8,482,111 B2 | 7/2013 | Haba |
| 8,492,203 B2 | 7/2013 | Lin et al. |
| 8,557,700 B2 | 10/2013 | Ishihara |
| 8,641,913 B2 | 2/2014 | Haba et al. |
| 8,692,135 B2 | 4/2014 | Funaya et al. |
| 8,709,933 B2 | 4/2014 | Haba et al. |
| 8,736,066 B2 | 5/2014 | Oganesian et al. |
| 8,841,765 B2 | 9/2014 | Haba et al. |
| 8,883,563 B1* | 11/2014 | Haba ................. H01L 25/105 438/112 |
| 8,884,427 B2* | 11/2014 | Woychik .............. H01L 21/486 257/723 |
| 8,900,922 B2 | 12/2014 | Lin et al. |
| 8,928,132 B2 | 1/2015 | Choi et al. |
| 8,945,998 B2 | 2/2015 | Hsu et al. |
| 8,946,884 B2 | 2/2015 | Kwon et al. |
| 8,978,247 B2 | 3/2015 | Yang et al. |
| 9,064,718 B1 | 6/2015 | Muniandy et al. |
| 9,984,961 B2 | 5/2018 | Ishihara |
| 2003/0116857 A1 | 6/2003 | Taniguchi et al. |
| 2003/0151067 A1 | 8/2003 | Iijima et al. |
| 2003/0155603 A1* | 8/2003 | Liu .................... H01L 28/90 257/309 |
| 2005/0093152 A1 | 5/2005 | Fjelstad et al. |
| 2005/0142842 A1 | 6/2005 | Jung |
| 2006/0022332 A1 | 2/2006 | Koyama et al. |
| 2006/0040428 A1 | 2/2006 | Johnson |
| 2006/0076671 A1 | 4/2006 | Kariya et al. |
| 2006/0202322 A1 | 9/2006 | Kariya et al. |
| 2007/0023888 A1 | 2/2007 | Fujii |
| 2007/0241463 A1 | 10/2007 | Yamaguchi et al. |
| 2008/0003402 A1 | 1/2008 | Haba et al. |
| 2008/0007927 A1 | 1/2008 | Ito et al. |
| 2008/0087459 A1 | 4/2008 | Das et al. |
| 2008/0090333 A1 | 4/2008 | Haba et al. |
| 2008/0108178 A1 | 5/2008 | Wilson et al. |
| 2008/0155820 A1 | 7/2008 | Arai et al. |
| 2008/0265430 A1 | 10/2008 | Ishihara |
| 2008/0289867 A1 | 11/2008 | Owens |
| 2008/0315372 A1 | 12/2008 | Kuan et al. |
| 2009/0115047 A1 | 5/2009 | Haba et al. |
| 2009/0166811 A1 | 7/2009 | Fujii |
| 2010/0071940 A1 | 3/2010 | Ejiri et al. |
| 2010/0102426 A1 | 4/2010 | Park et al. |
| 2010/0273293 A1 | 10/2010 | Haba et al. |
| 2010/0320582 A1 | 12/2010 | Pagaila et al. |
| 2010/0327421 A1 | 12/2010 | Luan |
| 2011/0057325 A1 | 3/2011 | Ishihara |
| 2011/0062549 A1 | 3/2011 | Lin |
| 2011/0155433 A1 | 6/2011 | Funaya et al. |
| 2012/0139082 A1 | 6/2012 | Oganesian et al. |
| 2012/0211885 A1 | 8/2012 | Choi et al. |
| 2012/0280386 A1* | 11/2012 | Sato ................. H01L 23/49517 257/737 |
| 2013/0050972 A1 | 2/2013 | Mohammed et al. |
| 2013/0093097 A1 | 4/2013 | Yu et al. |
| 2013/0161833 A1 | 6/2013 | Pendse |
| 2013/0224914 A1 | 8/2013 | Co et al. |
| 2013/0313012 A1 | 11/2013 | Yang et al. |
| 2014/0048951 A1 | 2/2014 | Lin et al. |
| 2014/0077389 A1 | 3/2014 | Shim et al. |
| 2014/0239479 A1* | 8/2014 | Start .................. H01L 23/3121 257/706 |
| 2015/0115458 A1* | 4/2015 | Palm ................. H01L 23/5389 257/774 |
| 2015/0206815 A1* | 7/2015 | Katkar .............. H01L 21/566 257/738 |
| 2015/0270232 A1 | 9/2015 | Chen et al. |
| 2015/0279823 A1* | 10/2015 | Haba ................. H01L 23/13 257/777 |
| 2016/0079214 A1* | 3/2016 | Caskey .............. H05K 3/46 257/686 |
| 2016/0133686 A1* | 5/2016 | Liao ................. H01L 28/60 257/532 |
| 2017/0162556 A1* | 6/2017 | Lin .................... H01L 23/24 |
| 2017/0178993 A1* | 6/2017 | Meyer ............... H01L 23/3157 |
| 2018/0130759 A1* | 5/2018 | Ho .................... H01L 24/81 |

(56) References Cited

U.S. PATENT DOCUMENTS

FOREIGN PATENT DOCUMENTS

| | | | |
|---|---|---|---|
| EP | 2555240 | A1 | 2/2013 |
| JP | 2001007248 | A | 1/2001 |
| JP | 2002050870 | A | 2/2002 |
| JP | 3311215 | B2 | 8/2002 |
| JP | 2005038898 | A | 2/2005 |
| JP | 2005136187 | A | 5/2005 |
| JP | 2006210758 | A | 8/2006 |
| JP | 2007250561 | A | 9/2007 |
| KR | 20010094893 | | 11/2001 |
| KR | 20060111449 | A | 10/2006 |
| KR | 20070102481 | A | 10/2007 |
| TW | 512467 | B | 12/2002 |
| TW | 200512843 | A | 4/2005 |
| WO | 2005059993 | A2 | 6/2005 |
| WO | 2005101475 | A1 | 10/2005 |
| WO | 2009136495 | A1 | 11/2009 |

OTHER PUBLICATIONS

Chinese Office Action for Application No. 201280030721.6 dated Oct. 8, 2014.

http://www.casio-micronics.co.jp/productfw_csp.html, home page of Casio Micronics Co., Ltd., "W-CSP", Sep. 24, 2010.

International Search Report and Written Opinion for Application No. PCT/JP2009/001998 dated Jun. 23, 2009.

International Search Report and Written Opinion for Application No. PCT/US2012/034209 dated Jul. 20, 2012.

Taiwanese Office Action for Application No. 101114254 dated Nov. 6, 2011.

\* cited by examiner

3D-INTERCONNECT

CROSS-REFERENCES TO RELATED APPLICATIONS

The present application is a divisional of U.S. patent application Ser. No. 15/493,917, filed on Apr. 21, 2017, and issued as U.S. Pat. No. 10,181,447, the disclosures all of which are incorporated herein by reference.

BACKGROUND OF THE INVENTION

The subject matter of the present application relates to microelectronic assemblies and fabrication methods, and more particularly to the structure of and fabrication method for a low-profile microelectronic package.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel.

Each chip package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

In many conventional designs, the chip package occupies an area of the circuit panel considerably larger than the area of the chip itself. In some designs which are referred to as "flip chip" designs, the front face of the chip confronts the face of a package substrate, and the contacts on the chip are bonded directly to contacts of the package substrate by solder balls or other connecting elements. In turn, the package substrate can be bonded to a circuit panel through terminals overlying the front face of the chip.

There are, however, applications in which a relatively larger package is desired. These include instances in which a relatively large fan-out area is needed to achieve connection to a larger array on a printed circuit board or the like. Many wafer-level packages present reliability issues in such relatively larger sizes due to an inherent increase in the effects of varying coefficients of thermal expansion among the components of the package. Such effects can also be visible in relatively smaller applications, particularly when contacts are placed in certain locations and when the package undergoes frequent heat-cycling.

Size is a significant consideration in any physical arrangement of one or more chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

In light of the foregoing, certain improvements can be made in the structure of microelectronic packages and assemblies which comprise a microelectronic package. In this regard, there remains a need for improved packages that are reliable, thin, testable and economical to manufacture.

BRIEF SUMMARY OF THE EMBODIMENTS

According to an aspect of the disclosure, a method of making a microelectronic package includes positioning a microelectronic element on a carrier; providing a conductive structure that overlies at least a portion of the microelectronic element and the carrier, the conductive structure having a base and a plurality of interconnection elements, the plurality of interconnection elements extending away from the base toward free ends that are positioned adjacent the carrier, the plurality of interconnection elements spaced apart from one another by a plurality of recesses; filling the plurality of recesses with an encapsulant such that the base overlies a first surface of the encapsulant and the plurality of interconnection elements are encapsulated within the encapsulant; removing the carrier to expose bond pads of the microelectronic element overlying the carrier, the free ends of the interconnection elements, and a second surface of the encapsulant opposed to the first surface; providing a redistribution structure to conductively connect exposed ends of the interconnection elements with terminals of the microelectronic package; and patterning the base of the conductive structure overlying the first surface of the encapsulant to provide external contacts of the microelectronic package.

In accordance with one or more particular aspects, the interconnection elements may have a first height greater than a second height of the microelectronic element.

In accordance with one or more particular aspects, positioning the microelectronic element further comprises positioning an active surface of the microelectronic element towards the carrier, such that bond pads of the microelectronic element are adjacent the carrier. At least some of the external contacts may overlie a rear surface of the microelectronic element. The patterning can include patterning a conductive routing layer overlying the microelectronic element. The conductive structure may overlie a rear surface of the microelectronic element such that there is a space between the rear surface of the microelectronic element and a surface of the base of the conductive structure, and wherein filling the plurality of recesses includes filing the space with encapsulant. A thermal interface material may be provided over a rear surface opposite the active surface of the microelectronic element such that the conductive structure overlies the thermal interface material. Filling the plurality of recesses may include filing a recess of the plurality of recesses in which the microelectronic element is encapsulated such that the encapsulant is adjacent edges of the microelectronic element and edges of the thermal interface material.

In accordance with one or more particular aspects of the disclosure, the method may further include positioning the microelectronic element within one of the plurality of recesses of the conductive structure, each of the recesses bounded by side walls and a bottom wall formed by a surface of the base, the side walls being edges of directly adjacent interconnection elements of the plurality of interconnection elements.

In accordance with one or more particular aspects of the disclosure, the method may further include etching a monolithic conductive material having planar first and second surfaces to form the conductive structure, including etching the monolithic conductive material to form the plurality of interconnection elements.

According to an aspect of the disclosure, a method of making a microelectronic package includes bonding a conductive structure to a carrier so that the conductive structure overlies a rear surface of a microelectronic element disposed on the carrier and an exposed top surface of the carrier, the conductive structure being a monolithic structure having a base and a plurality of interconnections extending continuously away from the base toward the carrier, the plurality of interconnections having free ends overlying the carrier, wherein the microelectronic element is positioned between at least two adjacent interconnections of the plurality of interconnections; encapsulating the plurality of interconnections and the microelectronic element with an encapsulant; removing the carrier to expose the free ends of the interconnections and bond pads of the microelectronic element; conductively connecting the free ends of the interconnections and bond pads of the microelectronic element with terminals of the microelectronic package; and patterning the conductive structure to form external contacts, at least some of the external contacts overlying the microelectronic element.

In accordance with one or more particular aspects of the disclosure, patterning the conductive structure occurs after the encapsulating.

In accordance with one or more particular aspects of the disclosure, positioning the conductive structure includes positioning ends of the plurality of interconnections in contact with the carrier, such that removal of the carrier exposes the ends.

In accordance with one or more particular aspects of the disclosure, the conductive structure is substantially planar.

In accordance with one or more particular aspects of the disclosure, patterning the conductive structure further includes patterning the conductive structure to create conductive connections overlying the microelectronic element.

In accordance with one or more particular aspects of the disclosure, the method further includes etching a solder mask to expose surfaces of the external contacts and depositing solder masses on exposed portions of the external contacts.

In accordance with one or more particular aspects of the disclosure, the method may further include etching a monolithic conductive material having planar first and second surfaces to form the monolithic structure, including etching the monolithic conductive material to form the plurality of interconnection elements.

According to an aspect of the disclosure, a microelectronic package includes a microelectronic element, a redistribution structure, a plurality of back side conductive components, and an encapsulant. The microelectronic element may have bond pads at a front surface and an opposed rear surface. The redistribution structure may be configured to conductively connect bond pads of the microelectronic element with terminals of the microelectronic package. The plurality of back side conductive connections may be etched monolithic structures, at least some of the back side conductive connections including a back side routing layer and a plurality of interconnection elements extending continuously away from the back side routing layer. At least one of the plurality of back side conductive connections may include a back side routing layer overlying the rear surface of the microelectronic element. The encapsulant may encapsulate the plurality of interconnection elements and the microelectronic element so as to form an interconnection surface, the interconnection surface may be a planar surface along which the bond pads, ends of the interconnection elements, and surface of the encapsulant extend. The interconnection surface may be adjacent the redistribution structure.

In accordance with one or more particular aspects of the disclosure, a height of the microelectronic element may be less than the height of the plurality of interconnection elements.

In accordance with one or more particular aspects of the disclosure, the redistribution structure includes contacts disposed at a first surface, the bond pads of the microelectronic element joined to the conductive components of the first surface of the redistribution structure.

BRIEF DESCRIPTION OF THE DRAWINGS

The accompanying drawings show exemplary embodiments in accordance with one or more aspects of exemplary assemblies and methods. However, these drawings should not be considered as limiting the scope of the claims, but provide examples that are for explanation and understanding only.

DETAILED DESCRIPTION

Figure 1:
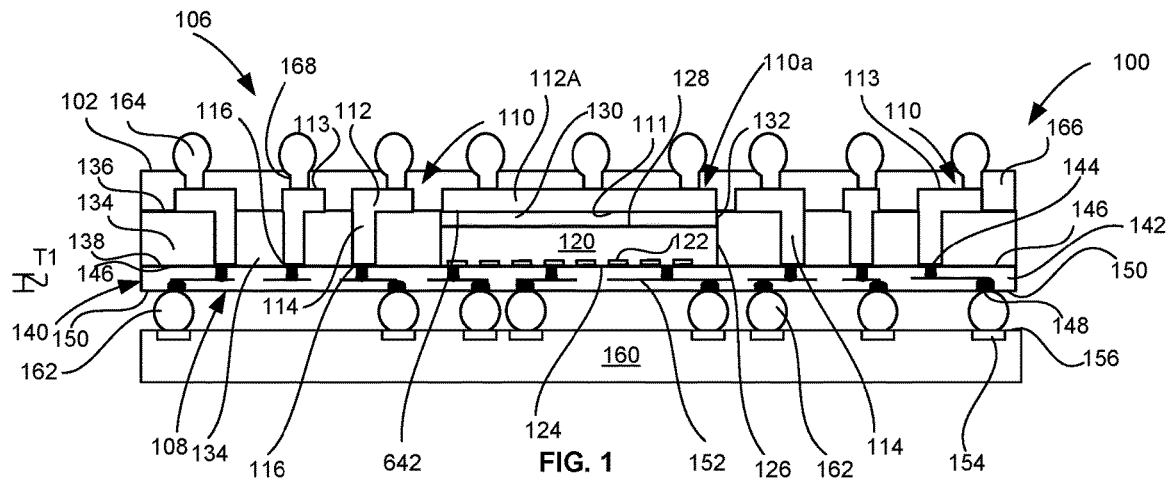
FIG. 1 is a cross-sectional view of an example microelectronic assembly in accordance with aspects of the disclosure.

As illustrated in FIG. 1, according to an embodiment, an assembly 100 can include a plurality of back side conductive components 110, a microelectronic element 120, a thermal interface material 130, and a redistribution structure 140 having an active or front surface 146 and a rear surface 150 opposite from the front surface 146. The first side 106 and second side 108 of the assembly 100 can be joined to and electrically interconnected with a component external to the assembly 100. For example, the rear contacts 148 of the assembly 100 are shown electrically coupled to panel contacts 154 at a major surface 156 of a circuit panel 160 by conductive bond material 162 confronting the second side 108 of the assembly 100, but the rear contacts 148 can be connected to other components, such as other chip packages and the like. The first and second sides 106,108 of the assembly 100 may also be interconnected to one another through the back side conductive components 110.

As used in this disclosure, terms such as "upper," "lower," "top," "bottom," "above," "below," and similar terms denoting directions, refer to the frame of reference of the components themselves, rather than to the gravitational frame of reference. With the parts oriented in the gravitational frame of reference in the directions shown in the figures, with the top of drawing being up and the bottom of the drawing being down in the gravitational frame of reference, the top surface of the microelectronic element is, indeed, above the bottom surface of the microelectronic element in the gravitational frame of reference. However, when the parts are turned over, with the top of the drawing facing downwardly in the gravitational frame of reference, the top surface of the microelectronic element is below the bottom surface of the microelectronic element in the gravitational frame of reference.

With reference to a dielectric region or a dielectric structure of a component, e.g., circuit structure, interposer, microelectronic element, capacitor, voltage regulator, circuit panel, substrate, etc., As used in this disclosure, a statement that an electrically conductive element is "at" a surface of the carrier, dielectric region, or other component indicates that, when the surface is not covered or assembled with any other element, the electrically conductive element is available for contact with a theoretical point moving in a direction perpendicular to that surface of the dielectric region from outside the dielectric region or component. Thus, a terminal or other conductive element which is at a surface of a dielectric region may project from such surface; may be flush with such surface; or may be recessed relative to such surface in a hole or depression in the dielectric region.

In FIG. 1, the directions parallel to the front and rear surfaces 146, 150 of the redistribution structure 140 are referred to herein as "horizontal" or "lateral" directions, whereas the directions perpendicular to the front and rear surfaces are referred to herein as upward or downward directions and are also referred to herein as the "vertical" directions. The directions referred to herein are in the frame of reference of the structures referred to. Thus, these directions may lie at any orientation to the normal or gravitational frame of reference.

The plurality of back side conductive components 110 may be formed from continuous unitary structures (FIGS. 4C-4D) that are at least partially pre-processed prior to encapsulation within the assembly 100. In one example, the back side conductive components 110 can include integrally-formed back side routing layers 112 and interconnection elements 114. The back side routing layers 112, 112A extend along an axis parallel to the front and rear surfaces of the microelectronic element 120. Interconnection elements 114 can extend away from and in a direction vertical to the back side routing layers 112, 112A. At least one back side conductive component, such as back side conductive component 110A, can overlie the microelectronic element 120, such that the back side conductive component only includes a routing layer 112A, and not an interconnection element. The back side conductive components 110 may be formed from at least one of copper, nickel, tungsten, cobalt, palladium, gold, silver, and/or their respective alloys.

A manufacturing process that incorporates back side conductive components 110 that are integrally formed from a pre-processed unitary structure, as opposed to being formed by plating conductive vias or the like, allows for improvements over known assemblies, including a reduction in the overall cost of the assembly, simplified fabrication, improvements on package warpage, small form factor, and various other improvements.

The microelectronic element 120 can be a semiconductor chip having a plurality of bond pads 122 at its front surface 124 and an edge surface 126 extending away from the front surface 124 of the microelectronic element 120. Each microelectronic element 120 also includes a rear surface 128 opposite from its front surface 124. In one example, the microelectronic element 120 may be a semiconductor chip having one or more memory storage arrays, which may include a particular memory type such as nonvolatile memory. Nonvolatile memory can be implemented in a variety of technologies some of which include memory cells that incorporate floating gates, such as, for example, flash memory, and others which include memory cells which operate based on magnetic polarities. Flash memory chips are currently in widespread use as solid state storage as an alternative to magnetic fixed disk drives for computing and mobile devices. Flash memory chips are also commonly used in portable and readily interchangeable memory drives and cards, such as Universal Serial Bus (USB) memory drives, and memory cards such as Secure Digital or SD cards, microSD cards (trademarks or registered trademarks of SD-3C), compact flash or CF card and the like. Flash memory chips typically have NAND or NOR flash type devices therein; NAND type devices are more common. Other examples of semiconductor chips are one or more DRAM, NOR, microprocessor, controller die, etc. or combinations thereof. Each semiconductor chip may be implemented in one of various semiconductor materials such as silicon, germanium, and gallium arsenide or one or more other Group III-V semiconductor compounds or Group II-VI semiconductor compounds, etc.

A material can be provided within the assembly 100 between the microelectronic element and the back side routing layer 112. In one example, a material capable of conducting heat away from the microelectronic element 120 may be used. In one example, the material is thermal interface material ("TIM"), but in other examples, a non-thermal interface material may alternatively or additionally be used. As shown, a thermal interface material 130 overlies the rear surface 128 of the microelectronic element 120. The thermal interface material 130 can also be used to bond the interior surface 111 of the back side routing layer 112 to the microelectronic element 120. Exemplary TIMs are those that exist in semisolid, gel-like (grease-like) state throughout the range of expected operating temperatures (e.g. 0 degrees Celsius to 200 degrees Celsius for some assemblies) or at least when the temperatures are high to make die cooling particularly desirable (20 degrees Celsius to 200 degrees Celsius for some assemblies). The thermal interface material 130 can fill the free space between microelectronic element 120 and the routing layer 112A of the backside conductive component 110. An exemplary TIM material is a thermal grease available from Arctic Silver, Inc. (having an office in California, USA); the grease's thermal conductivity is in the range of 1 W/mK.

The microelectronic element 120 and the interconnection elements 114 of the back side conductive components 110 may be encapsulated within an encapsulant 134. As shown, the back side routing layers 112 can overlie the top surface 136 of the encapsulant 134. Ends 116 of the interconnection elements 114 can be positioned adjacent the bottom surface 138 of the encapsulant 134. The encapsulant 134 can also extend adjacent the edge surfaces 126 of the microelectronic element 120, as well as the edge surfaces 132 of the thermal interface material 130.

In particular embodiments, the material forming the encapsulant 134 can be an epoxy-based polymer system with fillers, overmold, or potting compound. Such compound can provide stiffness to the overall assembly 100 to withstand internal differential thermal expansion between the assembly 100 and other components within the assembly. The compound may in some cases provide protection from shorting and moisture and/or water resistance. Such material can further help to provide a relatively rigid encapsulation which supports planarity of the overall assembly 100. The material of the encapsulant 134 may typically include a composition different from the composition of the dielectric layers of the redistribution structure 140.

The redistribution structure 140 can also be referred to as a "circuit structure" made of a plurality of dielectric layers and electrically conductive features thereon, as described generally in U.S. Provisional Application 62/159,136, the disclosure of which is incorporated by reference herein. The electrically conductive features may comprise a plurality of bumps at a first surface of the circuit structure facing the contacts of the dielectric element and joined thereto, a plurality of circuit structure contacts at a second surface opposite the first surface. The circuit structure may further include a plurality of traces, wherein the bumps and the circuit structure contacts are electrically coupled by the traces.

In one example, the redistribution structure 140 can comprise or can be made from a plurality of thin dielectric layers 142 stacked one atop another, and front contacts 144 at the front surface 146, rear contacts or terminals 148 at the rear surface 150, and conductive traces 152 electrically coupling the front contacts 144 with the terminals or rear contact 148 of the assembly 100. In one example, the redistribution structure 140 can have a maximum thickness T1 of less than 10 microns in a direction normal to the front surface 146 of the redistribution structure 140. In a particular example, the redistribution structure 140 can have a maximum thickness T1 of less than 30 microns in a direction normal to the front surface 146 of the redistribution structure 140.

The dielectric material of the dielectric layers 142 can be a material that can be deposited and patterned to form structures that support metallization thereon at a pitch of less than 5 microns, less than 2 microns, less than 1 micron, or at least as low as 0.2 microns. In one embodiment, each of the dielectric layers 142 can be planarized before depositing the next dielectric layer. In particular examples, the dielectric material can be deposited by chemical vapor deposition ("CVD"), spray coating, spin coating, roller coating, dipping, or the like.

The dielectric layers 142 may be made from various dielectric materials, such as, for example polymer base or a polyimide. In other examples, the dielectric layers may be composed of alternative dielectric materials, such as silicon dioxide and silicon nitride. In particular examples, the dielectric material can be a photosensitive polymer, e.g., benzocyclobutene ("BCB") based material, or other photosensitive material. In particular examples, the dielectric material can be deposited by chemical vapor deposition ("CVD"), spray coating, spin coating, roller coating, slot die coating, dipping, or the like. In particular examples, a self-planarizing dielectric material can be deposited to form one or more of the dielectric layers, such material having a tendency to form a flattened or flat upper surface as compared to topography that may be present in features underlying the upper surface.

The electrically conductive features of the redistribution structure 140 can provide electrical interconnection between the microelectronic element 120 and components external to the assembly 100. The electrically conductive features of the redistribution structure 140 can also provide chip-to-chip electrical interconnectivity among other microelectronic elements (not shown) that may be present in the assembly 100. The front contacts 144 of the redistribution structure 140 can be configured for flip-chip connection with a plurality of bond pads 122 at the front surface of the microelectronic element 120 and overlie different portions of an area of the front surface 146 of the redistribution structure 140. Stated another way, the front contacts 144 can be configured to be joined with the corresponding bond pads 122, in a state in which the front contacts 144 of the redistribution structure are juxtaposed with, i.e., face the corresponding bond pads 122 of the microelectronic element 120.

The electrically conductive features including the bumps 162, front contacts 144, rear contacts 148, and the conductive traces 152 can be made of an electrically conductive material, for example, a metal such as copper, aluminum, nickel, gold, or the like. In one example, the bumps 162 can comprise an electrically conductive bond material such as solder, tin, indium, copper, gold, a eutectic composition or combination thereof, another joining material such as a conductive paste or a conductive adhesive, and/or an electrically conductive composition that includes a metal component such as metal particles or flakes and a polymeric component. Such bumps can be deposited onto the front contacts 180.

In a particular embodiment, the conductive bond material of the bumps 162 can include an electrically conductive matrix material such as described in U.S. patent application Ser. Nos. 13/155,719 and 13/158,797, the disclosures of which are hereby incorporated herein by reference. In a particular embodiment, the conductive bond material of the bumps 162 can have a similar structure or be formed in a manner as described therein. In some examples, suitable materials for the conductive bond material of the bumps 162 can include polymers filled with conductive material in particle form such as metal-filled polymers, including, for example, metal-filled epoxy, metal-filled thermosetting polymers, metal-filled thermoplastic polymers, or electrically conductive inks.

Alternatively, the bumps 162 can comprise posts or pins, stud bumps or bond via interconnects each formed of extruded wire, such bumps projecting to heights thereof from the second side 108 of the assembly 100, and can be joined with components external to the microelectronic assembly 100, such as the circuit board 160.

Interconnection elements may be provided on the back side of the microelectronic assembly 100. Bumps 164 may also be provided on opposed portion of the assembly overlying the top surface 136 of the encapsulant 134 and provide an electrical interconnection to a component external to the back side of the microelectronic assembly 100. As shown, a dielectric layer, for example, solder mask 166, may overlie the first side 106 of the back side conductive component 110. Openings 168 in the solder mask 166 expose at least a portion of the outer surfaces 113 of the routing layer 112 so as to provide conductive contacts. The bumps 164 may be disposed at the conductive contacts exposed portions of the outer surfaces 113 of the back side routing layers 112 to provide an external connection. The bumps 164 can also be electrically connected to the bumps 162 at the second side 108 of the microelectronic assembly 100 through the back side conductive component 110, including the back side routing layer 112 and interconnection elements 114, as well as the redistribution structure 140.

Figure 2:
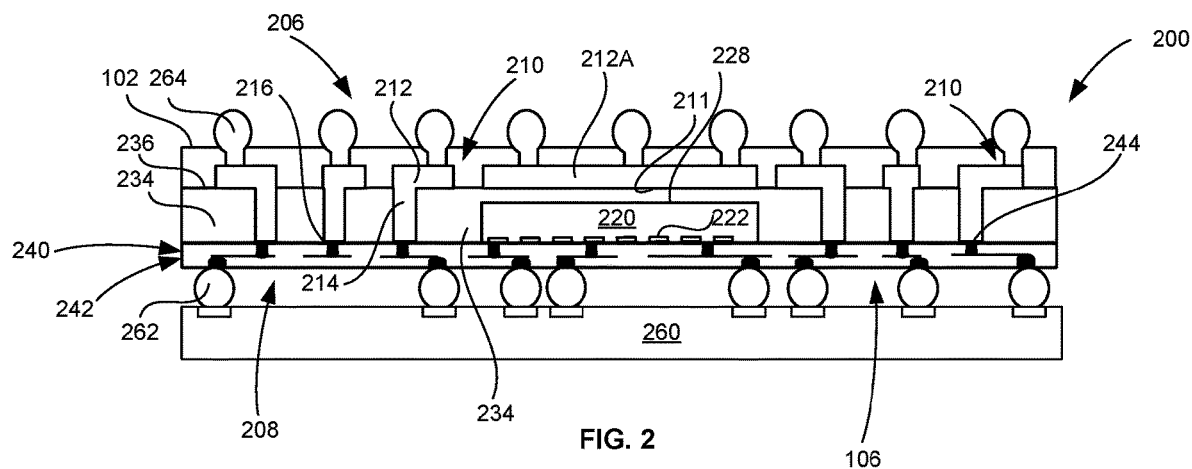
FIG. 2 is a cross-sectional view of an example microelectronic assembly in accordance with another aspect of the disclosure.

FIG. 2 illustrates an alternative microelectronic assembly 200 according to an embodiment. In this and other embodiments described herein, similar reference numerals will be used to identify similar elements. The microelectronic assembly 200 is virtually identical to the microelectronic assembly 100, except that it does not include a thermal interface material overlying the rear surface 228 microelectronic element 220, as in the previous embodiment. Rather, as shown, the encapsulant 234 fills the space between the rear surface 228 of the microelectronic element 220 and the interior surface 211 of the routing layer. The absence of the thermal layer allows for the back side routing layer 212A to overlie both the top surface 236 of the encapsulant 234, as well as the rear surface 228 of the microelectronic element 220.

As in the previously-described embodiment, microelectronic assembly 200 can include a plurality of back side conductive components 210, each of which can further include an integrally formed back side routing layer 212 and interconnection elements 214. The back side conductive components 210 may also include a back side routing layer 212A alone, without the presence of one or more interconnection elements 214. An encapsulant 234 encapsulates the microelectronic element 220 and the interconnection elements 214. Exposed ends 216 of the interconnection elements 214 are electrically connected with the redistribution structure 240, and in particular front contacts 244 at the surface of the redistribution structure 240. The back side routing layers 212 overlie the top surface 236 of the encapsulant 234. The microelectronic assembly 200 can be electrically interconnected with components external to the assembly 200 at both the rear side 208 and front side 206 of the assembly 200 through the back side conductive components 210 and the respective connections 264 and 262. In one example, as shown, the assembly 200 is joined to a circuit board 260.

Figure 3:
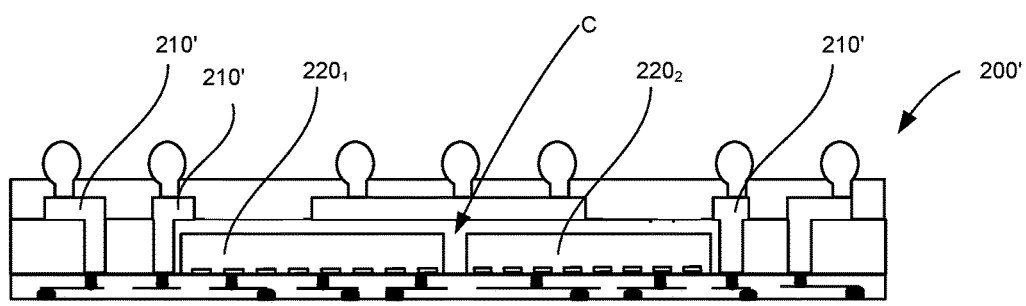
FIG. 3 is a cross-sectional view of an example microelectronic assembly in accordance with another aspect of the disclosure.

FIG. 3 illustrates another example microelectronic assembly 200'. The structure of the microelectronic assembly 200' is similar to the embodiment of FIG. 2, except that it includes two microelectronic elements 220$_1$, and 220$_2$. As shown, the two microelectronic elements 201' and 202' are positioned within a central portion C of the assembly 200'. In this example, to make space for two microelectronic elements 220$_1$, and 220$_2$, only two backside conductive components 210' are positioned to the left and to the right of the two microelectronic elements 220$_1$, and 220$_2$.

Figure 4A:
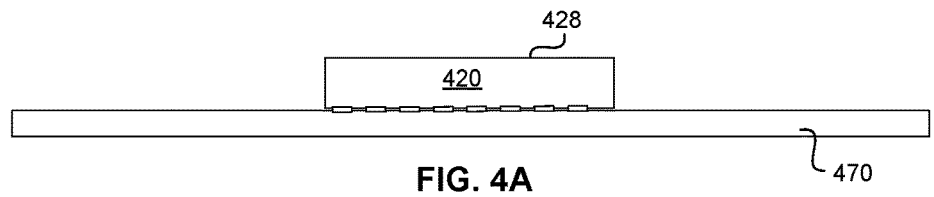
FIGS. 4A-4K illustrate an example method of making the microelectronic assembly of FIG. 1 in accordance with aspects of the disclosure.
Figure 4B:
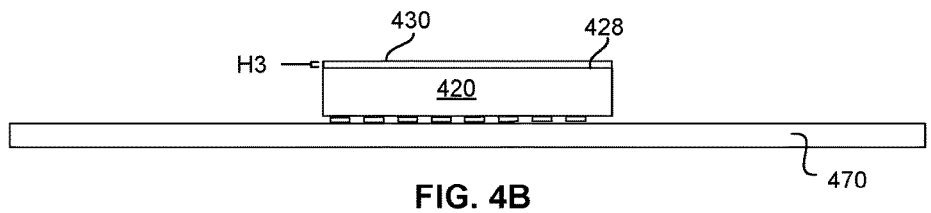

A method of fabricating a microelectronic assembly according to aspects of the disclosure will now be described relative to FIGS. 4A-4J, where similar reference numerals will be used to identify similar features. As seen in FIG. 4A, a microelectronic element 420 is supported on a carrier 470, either directly thereon, or through an intervening layer (not shown) which may be a peelable or other sacrificial layer. A thermal interface material 430 may also be provided over the rear surface of the microelectronic element 420, as shown in FIG. 4B. The thermal interface material layer 430 can alternatively be provided onto the rear surface 428 of the microelectronic element 420 prior to being deposited on the carrier 470. The carrier 470 can include or be made of glass, metal, silicon, or other material which can be removed by subsequent processing.

Figure 4C:
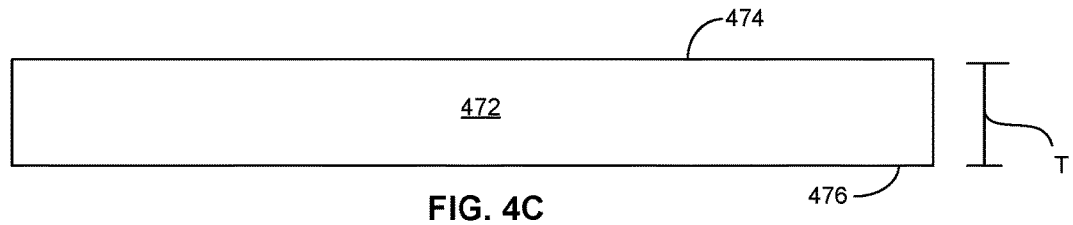

A conductive structure 472 can be used to provide back side routing and interconnection elements. An example conductive structure 472, prior to being patterned, is illustrated in FIG. 4C. The conductive structure 472 can be formed from a layer of conductive material which includes a planar first surface 474 and an opposed planar second surface 476. The selected conductive material can be any conductive material or combination of materials. In some examples, the conductive material may include at least one of copper, nickel, tungsten, cobalt, palladium, gold, silver, alloy 42, and/or their respective alloys.

Figure 4D:
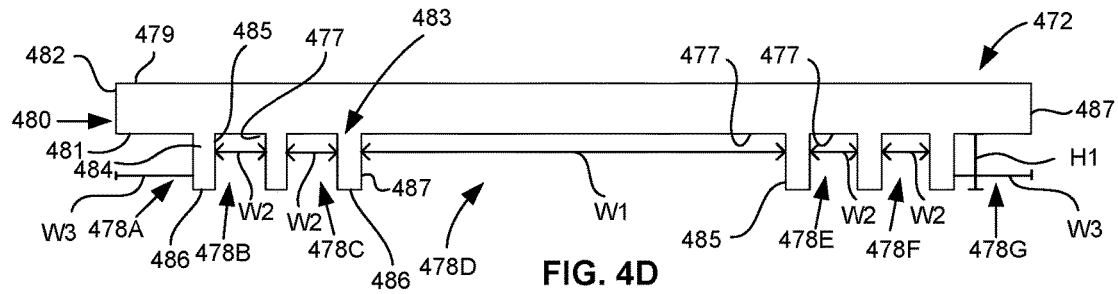

The conductive structure 472 may be a monolithic structure that is patterned, such as by etching or other known means, to include a plurality of interconnection elements. Example interconnection elements 484 are illustrated in FIG. 4D and may be formed by partial etching or etching portions of the conductive structure 472 to a height H1 that is less than the thickness of the overall conductive structure prior to etching. The height H1 may be, in some example, one-half or three-fourths of the thickness T of the conductive material prior to etching (FIG. 4C). But, in other examples, the height H1 may be greater than, less than, or between these amounts.

The interconnection elements 484 may extend outwardly and away from the base of the conductive structure 472. An example base 480 can includes a first outer surface 479 that is planar (which is the same surface as the first surface 474 of the conductive material 472), an opposed second surface 481 that is parallel to the first outer surface 484, and an edge surface 487 that extends between the first and second surfaces 479, 481. A first end 483 of each of the interconnection elements 484 is disposed at the second surface 481 of the base 480 of the conductive structure 472. The interconnection elements 484 can include edge surfaces 485 that extend from the second surface 481 of the base to opposed second ends 486 of the respective interconnection element 484. As shown, the second ends 486 of the interconnection elements 484 are exposed. The spacing and number of interconnection elements 484 may vary based upon the number of desired connections. Six interconnection elements 484 are shown in this example, but a greater or fewer number of interconnection elements may also be utilized.

A plurality of recesses 478A-478G are formed between each of the interconnection elements 484 and can vary in width. Recess 478D is a central recess that includes a width W1 that is at least large enough to receive the width of a microelectronic element. The interconnection elements 484 disposed on either side of the recess 478D may be equally spaced apart from one another. However, any desired pitch can be achieved. In this example recesses 478B-C and 478E-F may have widths W2 that are equal to the widths W3 of recesses 478A and 478G. In other examples, the widths W2 and W3 may differ. For example, widths W2 may be less than the widths W3 and vice versa.

The boundary or edge of a recess can be defined by a sidewall edge of one of the interconnection elements 484. For example, the edges 485 of two adjacent interconnection elements 484 and a floor 477 defined by the second surface 481 of the base 480 form the boundaries of the recess, such as recess 478B. Peripheral recesses 478A and 478G will only have a single interconnection element 484 directly adjacent the recess, such that only one recess wall surface is present. The central recess 478D is the largest of the recesses and can be sized to receive one or more microelectronic elements therein.

Figure 4E:
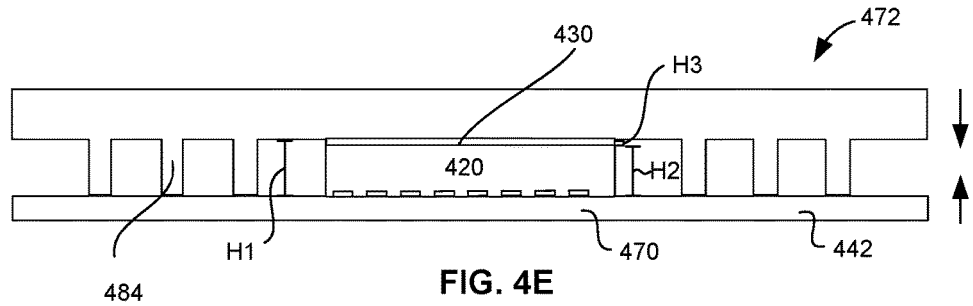

The conductive structure 472 can be joined with the carrier 470 and the microelectronic element 420, as shown, for example, in FIG. 4E. The conductive structure 472 can be bonded to the carrier by an adhesive material (not shown) or the like. The microelectronic element 420 and the thermal interface material 430 are shown fully positioned within the recess 478D. In this example, the height H1 of the interconnection element 484 and the recesses 478A-G is greater than a height H2 of the microelectronic element. The height H1 may also be greater than the height H3 of the combination of the thermal interface material 430 and the microelectronic element 420. The height H2 of the microelectronic element may vary depending on the application. In some examples, the height H2 of the microelectronic element 420 may vary from 50-100 microns. The height H1 can be greater than 100 microns or less than 50 microns. In an example where the height H2 of the microelectronic element is approximately 100 microns, the conductive structure 472 may have a thickness T of approximately 8 millimeters (204 microns). The conductive structure 472 may then be patterned to accommodate the height H2 of the microelectronic element by one-half etching to form interconnection elements 484. The interconnection elements 484 may have a height H1 is approximately 4 millimeters (102 microns), which is one-half the thickness T. This will allow the height H1 of the interconnection element and recess to accommodate the height H2 of the microelectronic element.

Figure 4F:
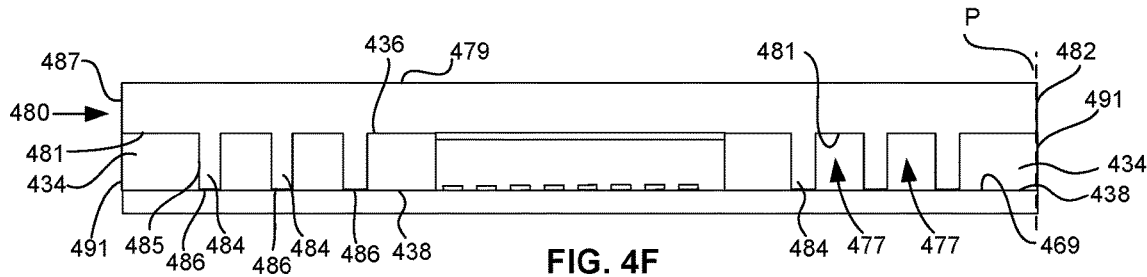

As seen in FIG. 4F, a dielectric encapsulant 434 may be provided to encapsulate the microelectronic element 420 and each of the interconnection elements 484. The encapsulant 434 can occupy and fill the space between individual interconnection elements 484. As shown, the encapsulant 434 is adjacent each of the edges 485 of the interconnection elements 484. The encapsulant 434 can have outer edge 491 aligned with and extending along the same plane P as the outer edges 482 of the base 480 of the conductive structure 472. A top edge 436 of the encapsulant 434 can be coplanar with and positioned directly adjacent the second surface 481 of the base 480. A bottom surface 438 of the encapsulant 434 can be coplanar with and positioned directly adjacent the ends 486 of the interconnection elements 484.

In one example, the dielectric encapsulation can be formed by flowing an encapsulant into a mold onto the elements shown in FIG. 4E to form a molded encapsulation. At the time of encapsulation, the ends of the interconnection remain covered by the carrier 470. Such encapsulation 434 may in some cases in the final assembly resist strain due to mismatch between coefficients of thermal expansion between the encapsulation, the microelectronic element, the carrier 470, and the redistribution structure 440 (FIG. 4H), which can be attached and electrically connected thereto.

Figure 4G:
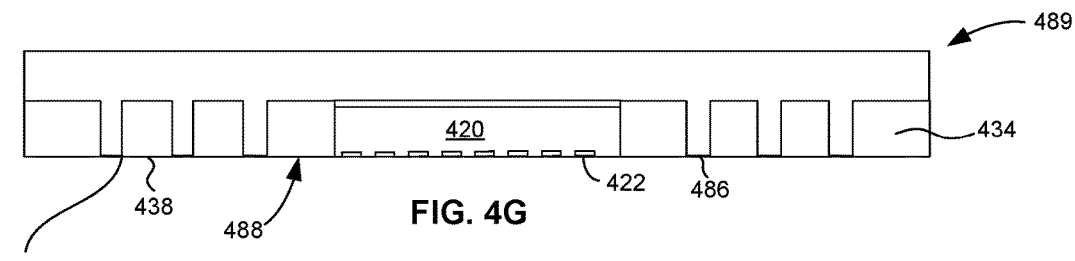
Figure 4H:
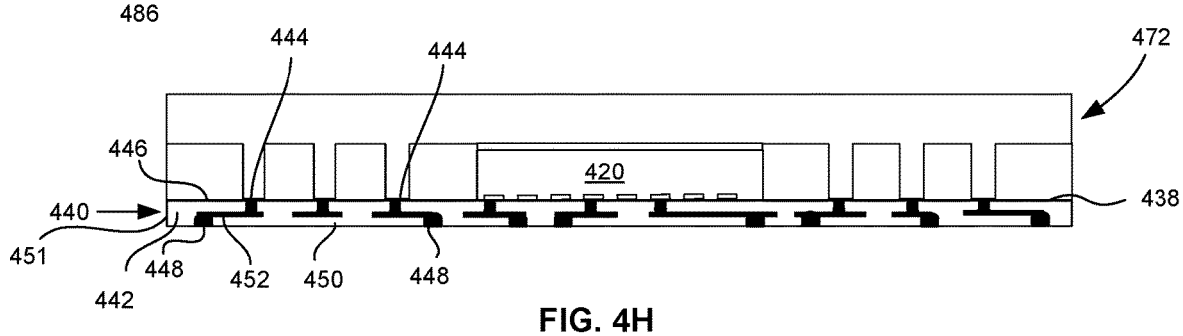
Figure 4I:
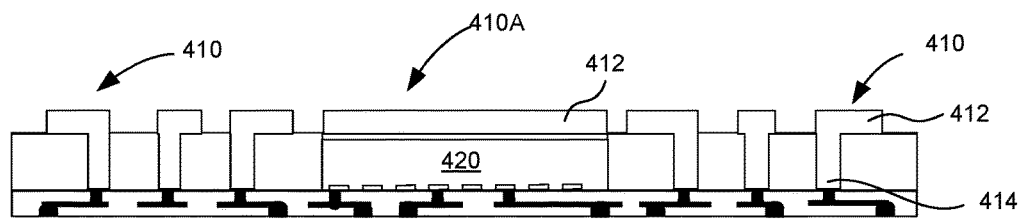

Thereafter, as seen in FIG. 4G, the carrier 470 can be removed to form an encapsulated in-process assembly 489, which exposes an interconnection surface 488 thereat. The exposed ends 486 of the interconnection elements 484, the bond pads 422 of the microelectronic element 420, and the bottom surface 438 of the encapsulant 434 extend along a substantially planar line and form an interconnection surface 488.

A redistribution structure can be provided at the interconnection surface. The redistribution structure, such as, for example, the redistribution structure 440 shown in FIG. 4H, can be prefabricated prior to its electrical connection to the interconnection elements 484 and bond pads 422 of the microelectronic element 420. The redistribution structure 440 may have a front surface 446, a rear surface 450, and an edge surface 451. In one example, the prefabricated redistribution structure may first be manufactured on a temporary carrier (not shown) and later joined to the interconnection surface 488 of the redistribution structure 440. Alternatively, the redistribution structure 440 can be manufactured directly thereon with a standard wafer level packaging process.

In the example of forming the redistribution structure directly thereon, the process can be performed so as to form a plurality of dielectric layers 442 and electrically conductive features such as described above with reference to FIG. 1A. For example, the dielectric layers 442 to be formed can include the front contacts 444 at the front surface 446 of the redistribution structure 440. The last one of the dielectric layers 442 to be formed can include rear conductive elements 448 at the rear surface 450 of the redistribution structure 440. The rear conductive elements 448 can be electrically coupled to the front contacts 444 by the conductive traces 452.

The conductive structure 472 can be processed to form a plurality of back side conductive components. As shown, for example, in FIG. 4I, the conductive structure 472 can be thinned and patterned by etching to form a plurality of back side conductive components 410. The back side conductive components 410 will further include a back side routing layer 412 and integrally formed interconnection elements 414, which are the same as the interconnection elements 484. The back side conductive component 410A can overlie the microelectronic element 420 and include only the back side routing layer 412.

Figure 4J:
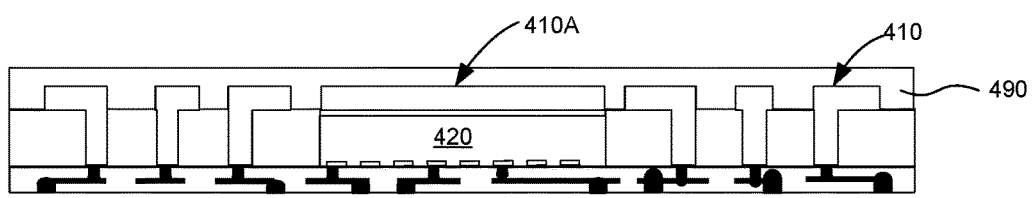
Figure 4K:
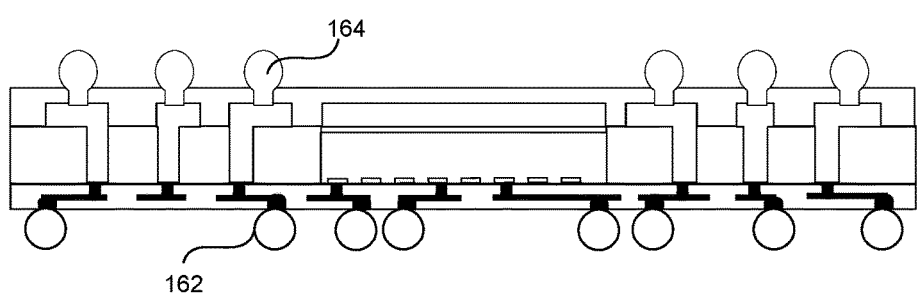

A dielectric layer, such as a solder mask 490 may be provided over the back side routing layer 412 of the back side conductive component 410, as shown in FIG. 4J. Thereafter, openings in the dielectric layer may be formed to allow for conductive masses, such as solder mass 464, to be electrically connected with the back side routing layer 412. Conductive masses 162 may also be provided on the rear conductive elements 448 of the redistribution structure 440.

In the alternative example where the redistribution structure carrier is pre-formed, the front surfaces of the redistribution structure may be bonded to the exposed ends 486 of the interconnection elements 414 with an adhesive (not shown). In one embodiment, the adhesive may be or include one or more layers of epoxy, elastomer, polyimide or other polymeric material. In some cases, a material used as a conformal dielectric coating over one or more of the microelectronic elements may also function as an adhesive. In one embodiment, such conformal dielectric coating can be a polyxylylene material such as commonly referred to as "parylene". Parylene can also be used as a die attach adhesive between adjacent microelectronic elements.

Figure 5A:
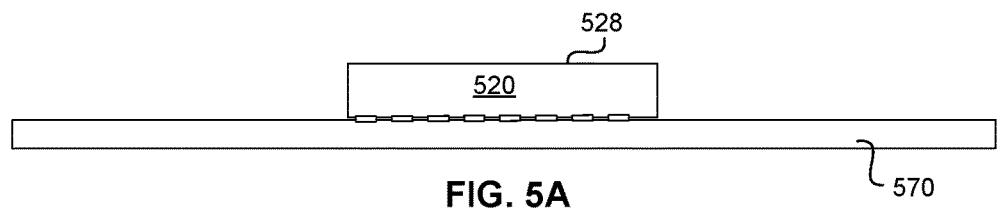
FIGS. 5A-5J illustrate an example method of making the microelectronic assembly of FIG. 2 in accordance with aspects of the disclosure.
Figure 5B:
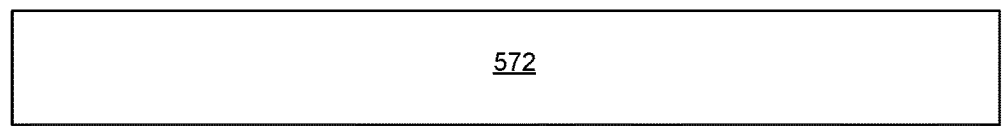
Figure 5C:
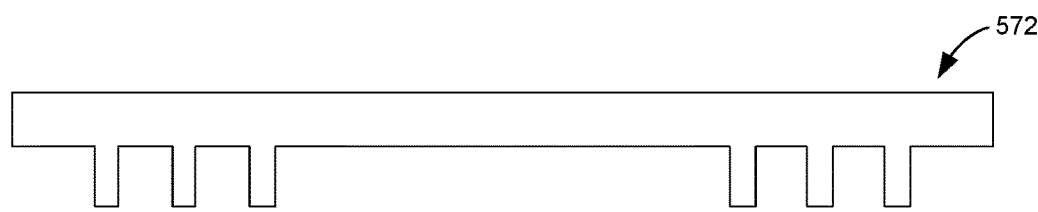
Figure 5D:
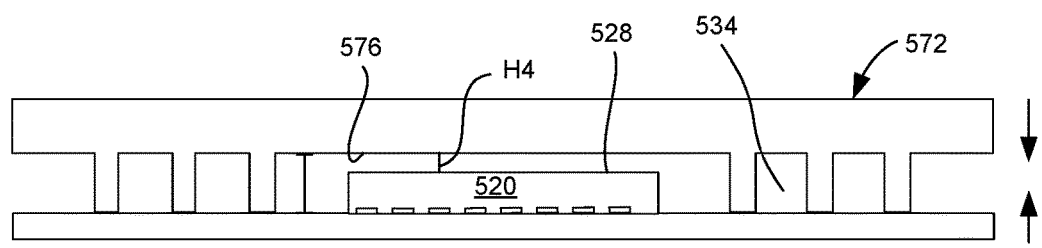

With reference to FIGS. 5A-5J, an example method of assembling the microelectronic assembly of FIG. 2 is provided. The method of manufacturing the assembly is otherwise identical to the previous embodiment (FIGS. 4A-4K), except that an interface material overlying the microelectronic element 520 is not present within the assembly. As shown in FIG. 5A, the microelectronic element 520 is provided on a carrier 570. The conductive component 572 (FIG. 5B) can be processed (FIG. 5C) in the same way as previously described in FIGS. 4B-4C and joined with the microelectronic element 520 (FIG. 5D), such that the conductive component 572 overlies the rear surface 528 of the microelectronic element 520. The rear surface 528 of the microelectronic element 520 may be spaced apart from the second surface 576 of the conductive structure 572 by a distance H4. The distance H4 can be any desired distance. The distance H4 may be greater in circumstances where it may be desired to increase the distance between the microelectronic element and the conductive component 572. In other examples where it is desired to minimize the overall height of the assembly, the conductive structure 572 can extend along the rear surface 528 of the microelectronic element 520.

Figure 5E:
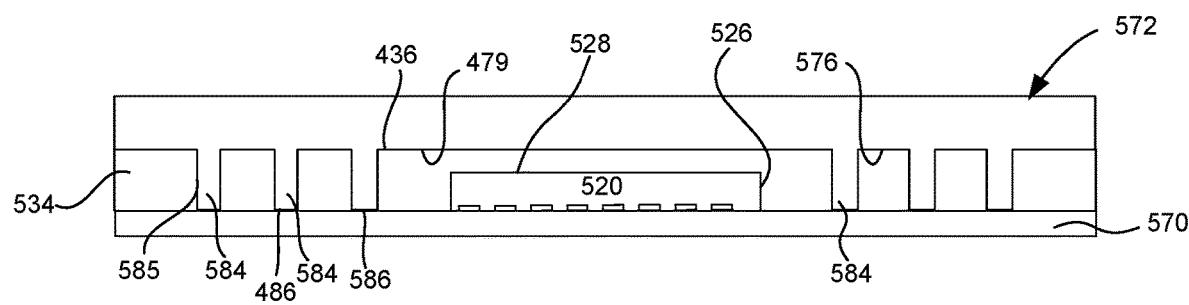
Figure 5F:
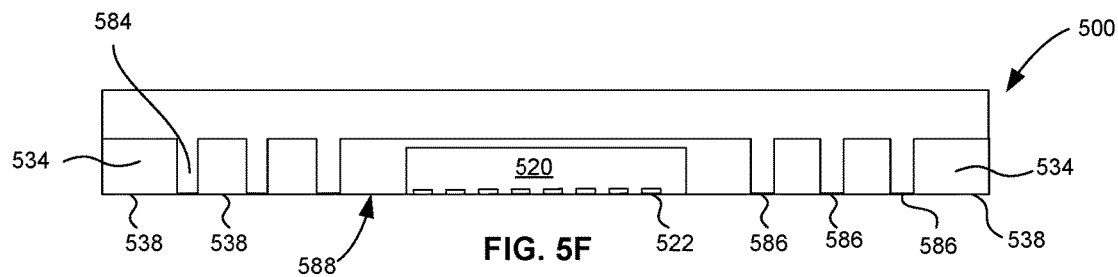
Figure 5G:
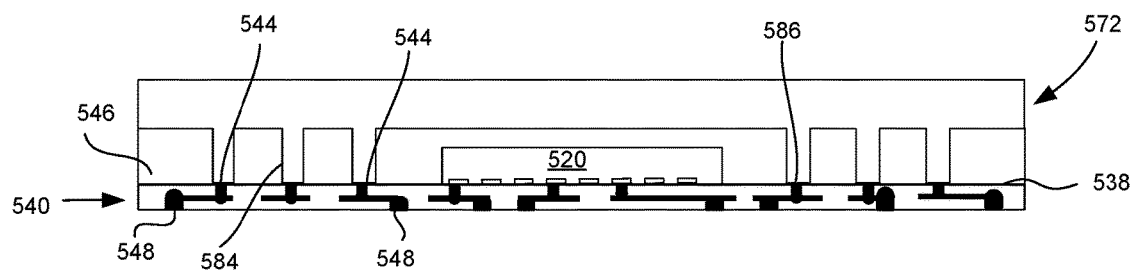
Figure 5H:
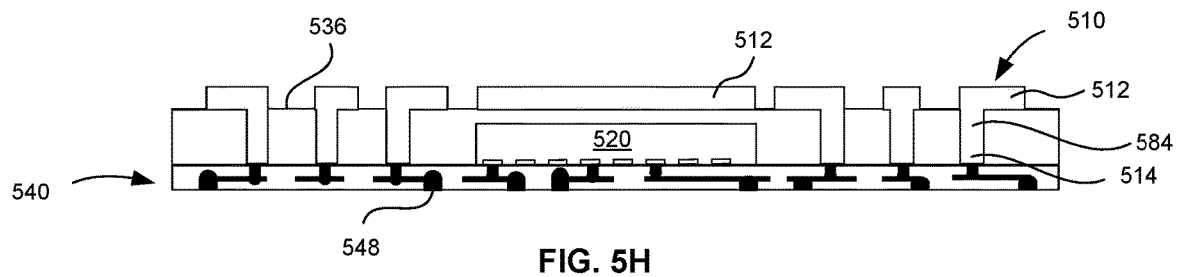
Figure 5I:
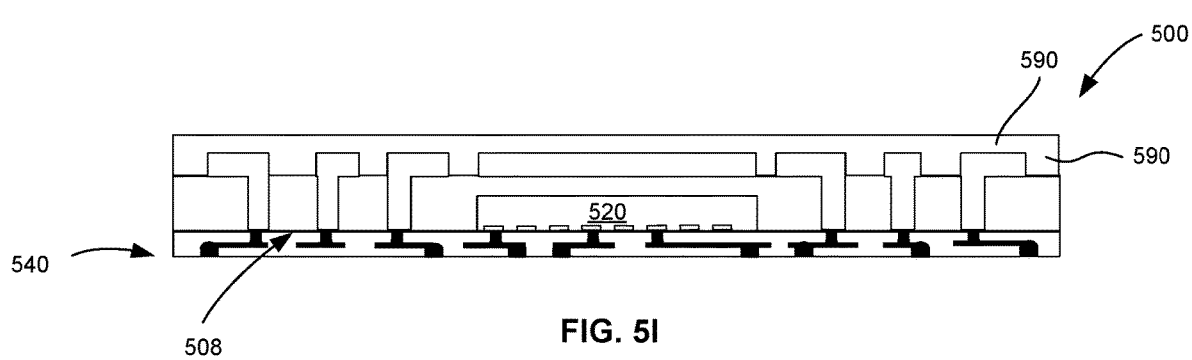
Figure 5J:
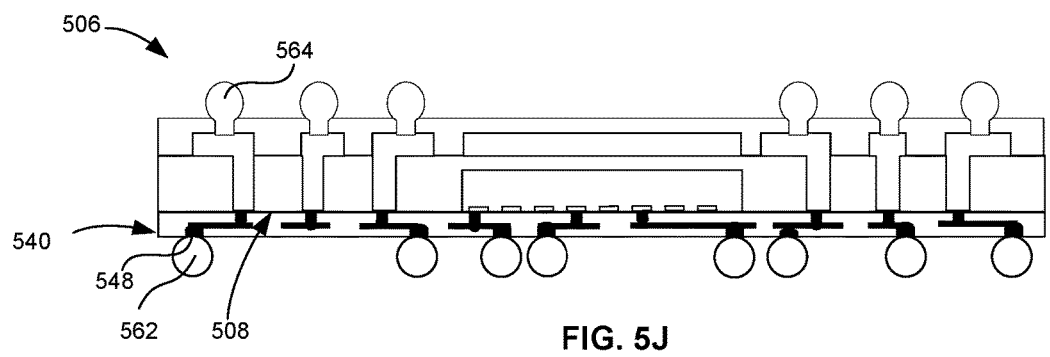

The microelectronic element 520 and conductive component 572 can be encapsulated, as shown in FIG. 5E. An encapsulant 534 can fill the space between the bottom surface 576 of the conductive component 572, the rear surface 528 of the microelectronic element, the edge surface 526 of the microelectronic element 520, and the edges 585 of the conductive interconnection elements 584. Once encapsulated, the carrier 570 can be removed to expose an interconnection surface 588. As shown in FIG. 5F, an interconnect surface 588 includes the ends 586 of the interconnection elements 584, the bond pads 522, and bottom surface 538 of the encapsulant 534. A redistribution structure 540 can be manufactured, as previously disclosed herein, and joined to and electrically connected with the interconnection surface 588. (FIG. 5G). Front contacts 544 of the redistribution structure 540 can be juxtaposed with the ends 586 of the interconnection element 584 and the bond pads 522 of the microelectronic element 520. The conductive component 572 can then be etched so as to form a plurality of back side conductive components 510. The conductive components 510 can include back side routing 512 along the top surface 536 of the encapsulant, which is integrally formed with the interconnection elements 584 as shown in FIG. 5H. A dielectric layer 590, as shown in FIG. 5I, can be provided over the back side routing 512 and an opening (FIG. 5J) provided therein to allow for conductive bumps 564 to be provided at the first side 506 of the assembly 500. (FIGS. 5I and 5J.) Conductive bond bumps 562 can also be joined with the rear contracts 548 of the redistribution structure 540 at the second side 508 of the assembly 500.

Figure 6:
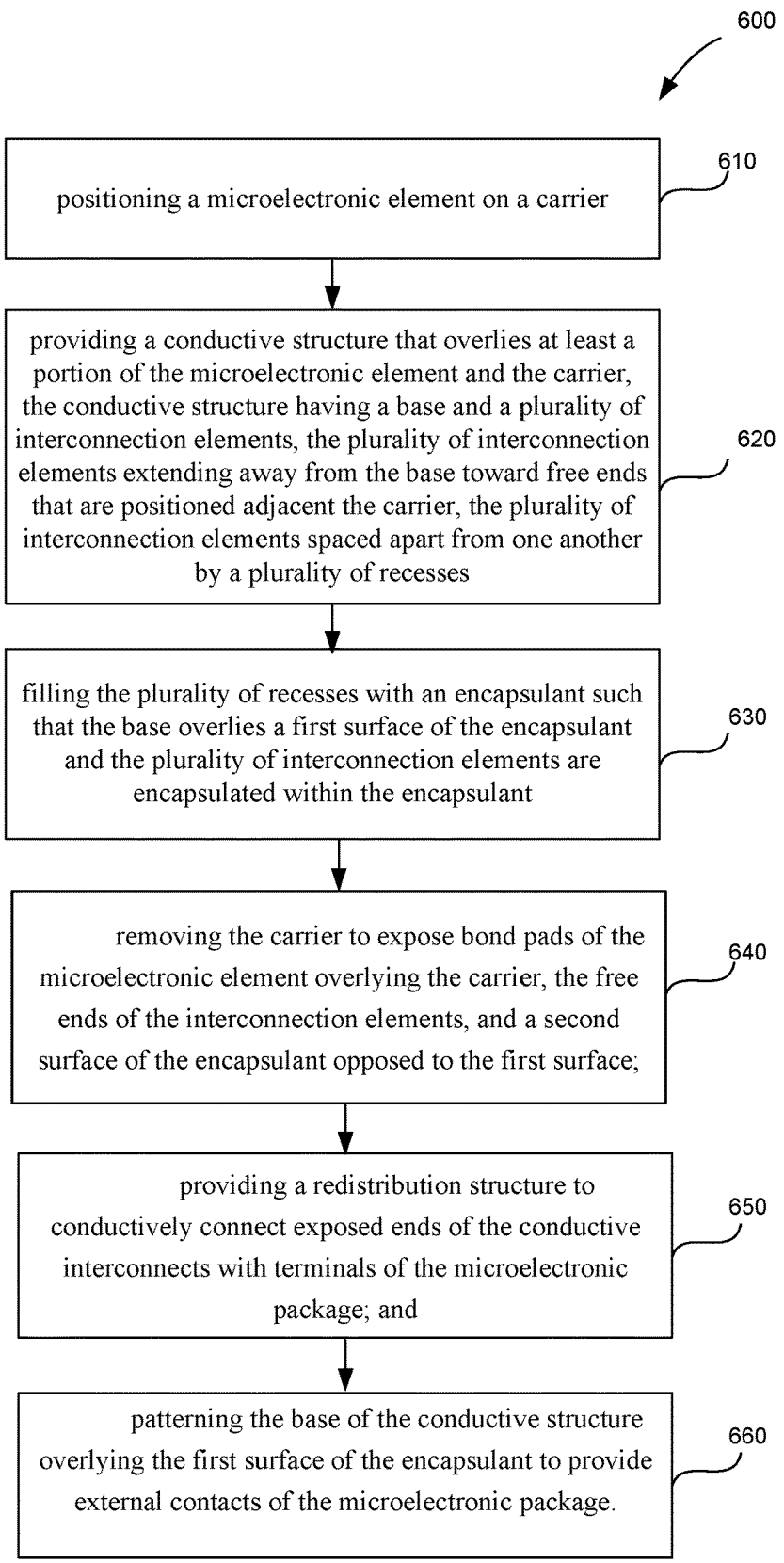
FIG. 6 is an example method in accordance with aspects of the disclosure.

Turning now to FIG. 6, a method of manufacturing a microelectronic assembly is shown. At box 610, a microelectronic element can be positioned on a carrier. At box 620, conductive structure can be provided that overlies at least a portion of the microelectronic element and the carrier. The conductive structure can include a base and a plurality of interconnection elements. The plurality of interconnection elements may extend away from the base toward free ends of the interconnection element that are positioned adjacent the carrier. The plurality of interconnection elements spaced apart from one another by a plurality of recesses. At box 620, the plurality of recesses may be filled with an encapsulant such that the base of the conductive structure overlies a first surface of the encapsulant and the plurality of interconnection elements are encapsulated within the encapsulant. The carrier may be removed, at box 630, to expose bond pads of the microelectronic element overlying the carrier, the free ends of the interconnection elements, and a second surface of the encapsulant opposed to the first surface. A redistribution structure may be provide that conductively connects the exposed ends of the conductive interconnection elements with terminals of the microelectronic package at box 640. The base of the conductive structure overlying the first surface of the encapsulant may be patterned at box 650, to provide external contacts of the microelectronic package.

Figure 7:
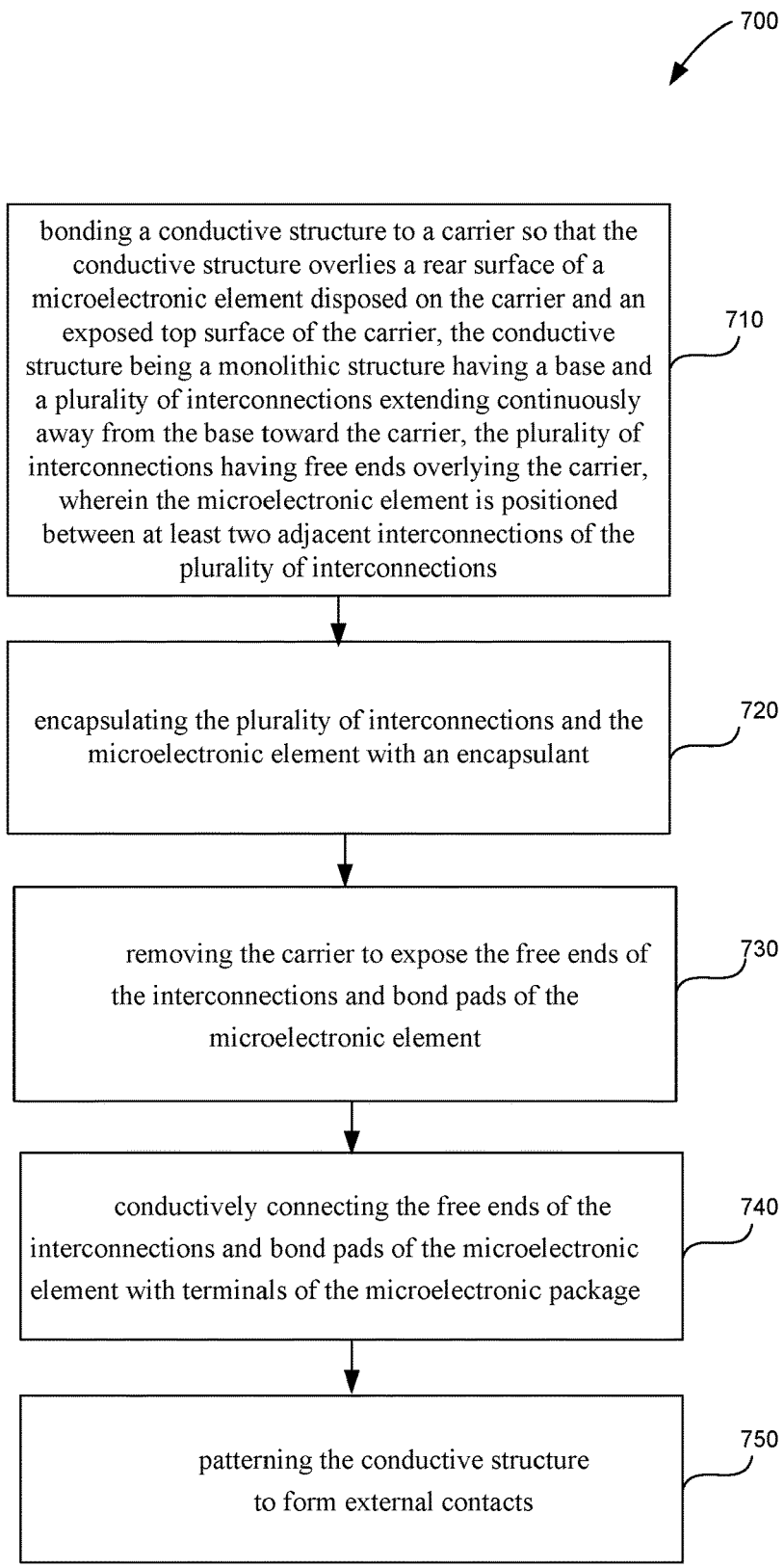
FIG. 7 is an example method in accordance with aspects of the disclosure.

With reference to FIG. 7, another method of manufacturing a microelectronic assembly according to aspects of the disclosure is described. At box 710, a conductive structure is bonded to a carrier so that the conductive structure overlies a rear surface of a microelectronic element disposed on the carrier and an exposed top surface of the carrier. The conductive structure may be a monolithic structure having a base and a plurality of interconnections extending continuously away from the base toward the carrier. The plurality of interconnections may have free ends overlying the carrier, wherein the microelectronic element is positioned between at least two adjacent interconnections of the plurality of interconnections. The plurality of interconnections and the microelectronic element may be encapsulated with an encapsulant at box 720. The carrier may be removed to expose the free ends of the interconnections and bond pads of the microelectronic element at box 730. The free ends of the interconnections and the bond pads of the microelectronic element may be conductively connected with terminals of the microelectronic package at box 740. AT box 750, the conductive structure may be patterned to form external contacts. At least some of the external contacts overlie the microelectronic element.

Figure 8:
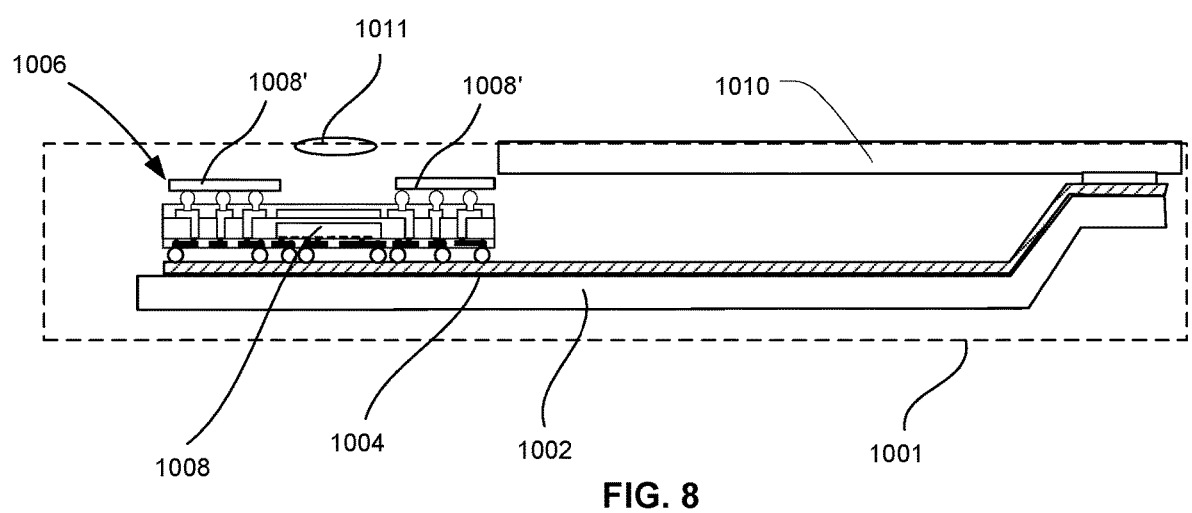
FIG. 8 is a schematic depiction of a system according to one embodiment of the disclosure.

The assemblies described above with reference to FIGS. 1-7 above can be utilized in construction of diverse electronic systems, such as the system 1000 shown in FIG. 8. For example, the system 1000 in accordance with a further embodiment of the invention includes one or more modules or components 1006 such as the assemblies as described above, in conjunction with other electronic components 1010 and 1011.

In the exemplary system 1000 shown, the system can include a circuit panel, motherboard, or riser panel 1002 such as a flexible printed circuit board, and the circuit panel can include numerous conductors 1004, of which only one is depicted in FIG. 8, interconnecting the modules or components 1006, 1010, and 1011 with one another. Such a circuit panel 1002 can transport signals to and from each of the microelectronic packages and/or microelectronic assemblies included in the system 1000. However, this is merely exemplary; any suitable structure for making electrical connections between the modules or components 1006 can be used.

In a particular embodiment, the system 1000 can also include a processor such as the semiconductor chip 1008, such that each module or component 1006 can be configured to transfer a number N of data bits in parallel in a clock cycle, and the processor can be configured to transfer a number M of data bits in parallel in a clock cycle, M being greater than or equal to N. Additionally, other chip packages, such as chip packages 1008' may be provided within the system, as well.

In the example depicted in FIG. 8, the component 1008 is a semiconductor chip and component 1010 is a display screen, but any other components can be used in the system 1000. Of course, although only two additional components 1010 and 1011 are depicted in FIG. 8 for clarity of illustration, the system 1000 can include any number of such components.

Modules or components 1006 and components 1008, 1010, and 1011 can be mounted in a common housing 1001, schematically depicted in broken lines, and can be electrically interconnected with one another as necessary to form the desired circuit. The housing 1001 is depicted as a portable housing of the type usable, for example, in a cellular telephone or personal digital assistant, and screen 1010 can be exposed at the surface of the housing. In embodiments where a structure 1006 includes a light-sensitive element such as an imaging chip, a lens 1011 or other optical device also can be provided for routing light to the structure. Again, the simplified system shown in FIG. 8 is merely exemplary; other systems, including systems commonly regarded as fixed structures, such as desktop computers, routers and the like can be made using the structures discussed above.

The incorporation of back side conductive components manufactured according to the disclosure herein into microelectronic assemblies can provide improvements over the art. Such assemblies allow for lower cost construction due to the materials needed and a small form factor. Additionally, for assemblies including a redistribution structure, the back side routing layer can counter-balance warpage caused by the redistribution structure. While certain examples were disclosed herein, it should be appreciated that back side routing layers can be further designed for antenna layout, electromagnetic interference shielding, three-dimensional connections, and heat dissipation.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same or similar reference numbers in different drawings can identify the same or similar elements.

The invention claimed is:

1. A method of making a microelectronic package, comprising:
bonding a conductive structure to a carrier so that the conductive structure overlies a rear surface of a microelectronic element disposed on the carrier and an exposed top surface of the carrier, the conductive structure being a monolithic structure having a base and a plurality of interconnections extending continuously away from the base toward the carrier, the plurality of interconnections having free ends overlying the carrier, wherein the microelectronic element is positioned between at least two adjacent interconnections of the plurality of interconnections;
encapsulating the plurality of interconnections and the microelectronic element with an encapsulant;
removing the carrier to expose the free ends of the interconnections and bond pads of the microelectronic element;
conductively connecting the free ends of the interconnections and bond pads of the microelectronic element with terminals of the microelectronic package; and
patterning the conductive structure to form external contacts, at least some of the external contacts overlying the microelectronic element.

2. The method of claim 1, wherein patterning the conductive structure occurs after the encapsulating.

3. The method of claim 1, wherein positioning the conductive structure includes positioning ends of the plurality of interconnections in contact with the carrier, such that removal of the carrier exposes the ends.

4. The method of claim 1, wherein the conductive structure is substantially planar.

5. The method of claim 1, wherein patterning the conductive structure further includes patterning the conductive structure to create conductive connections overlying the microelectronic element.

6. The method of claim 1, further comprising etching a solder mask to expose surfaces of the external contacts and depositing solder masses on exposed portions of the external contacts.

7. The method of claim 1, further comprising etching a monolithic conductive material having planar first and second surfaces to form the conductive structure, including etching the monolithic conductive material to form the plurality of interconnections.

8. The method of claim 1, wherein the interconnections have a first height greater than a second height of the microelectronic element.

9. The method of claim 1, wherein positioning the microelectronic element further comprises positioning an active surface of the microelectronic element towards the carrier, such that bond pads of the microelectronic element are adjacent the carrier.

10. The method of claim 9, wherein patterning includes patterning a conductive routing layer overlying the microelectronic element.

11. The method of claim 9, wherein the conductive structure overlies a rear surface of the microelectronic element such that there is a space between the rear surface of the microelectronic element and a surface of the base of the conductive structure.

12. The method of claim 9, further comprising providing a thermal interface material over a rear surface opposite the active surface of the microelectronic element such that the conductive structure overlies the thermal interface material.

13. The method of claim 1, wherein the plurality of interconnections are spaced apart from one another to form a plurality of recesses therebetween, and wherein the method further comprises filling the plurality of recesses with encapsulant.

14. The method of claim 13, wherein filling the plurality of recesses includes filling a recess of the plurality of recesses in which the microelectronic element is positioned such that the encapsulant is adjacent to edges of the microelectronic element and to edges of the plurality of interconnections bounding the microelectronic element.

15. The method of claim 13, further comprising positioning the microelectronic element within one of the plurality of recesses of the conductive structure, each of the recesses bounded by side walls and a bottom wall formed by a surface of the base, the side walls being edges of directly adjacent interconnection elements of the plurality of interconnections.

16. The method of claim 1, wherein the encapsulating includes filling a space between a surface of the base and adjacent ones of the plurality of interconnections with encapsulant.

17. The method of claim 16, wherein the space further overlies a surface of the carrier to which the conductive structure is bonded.

18. The method of claim 16, wherein the patterning includes patterning the conductive structure to form contacts overlying the rear surface of the microelectronic element.

19. A method of making a microelectronic package, comprising:
bonding a conductive structure to a carrier so that the conductive structure overlies a rear surface of a microelectronic element disposed on the carrier and an exposed top surface of the carrier, the conductive structure being a monolithic structure having a base and a plurality of interconnections extending continuously away from the base toward the carrier, the plurality of interconnections having free ends overlying the carrier, wherein the microelectronic element is positioned between at least two adjacent interconnections of the plurality of interconnections;

encapsulating the plurality of interconnections and the microelectronic element with an encapsulant;

removing the carrier to expose the free ends of the interconnections and bond pads of the microelectronic element;

conductively connecting the free ends of the interconnections and bond pads of the microelectronic element with terminals of the microelectronic package; and patterning the conductive structure to form external contacts, at least some of the external contacts overlying the microelectronic element, wherein the bonding of the base and the plurality of interconnections to the carrier occurs before encapsulating.

20. The method of claim 19, wherein the encapsulating includes filling a space between a surface of the base and adjacent ones of the plurality of interconnections with the encapsulant.

* * * * *